US008394196B2

(12) United States Patent
Kim

(10) Patent No.: US 8,394,196 B2
(45) Date of Patent: Mar. 12, 2013

(54) FORMATION OF IN-SITU PHOSPHORUS DOPED EPITAXIAL LAYER CONTAINING SILICON AND CARBON

(75) Inventor: Yihwan Kim, Milpitas, CA (US)

(73) Assignee: Applied Materials, Inc., Santa Clara, CA (US)

(*) Notice: Subject to any disclaimer, the term of this patent is extended or adjusted under 35 U.S.C. 154(b) by 1186 days.

(21) Appl. No.: 11/609,826

(22) Filed: Dec. 12, 2006

(65) Prior Publication Data

US 2008/0138939 A1 Jun. 12, 2008

(51) Int. Cl.
*C30B 21/04* (2006.01)
(52) U.S. Cl. ............... 117/89; 117/85; 117/88; 117/92; 117/104; 117/105
(58) Field of Classification Search ............... 117/9, 85, 117/88–92, 103–108; 438/478, 479
See application file for complete search history.

(56) References Cited

U.S. PATENT DOCUMENTS

| 5,108,792 | A | 4/1992 | Anderson et al. | |
|---|---|---|---|---|
| 5,179,677 | A | 1/1993 | Anderson et al. | |
| 5,186,718 | A | 2/1993 | Tepman et al. | |
| 6,803,297 | B2 | 10/2004 | Jennings et al. | |
| 6,821,825 | B2 * | 11/2004 | Todd et al. | 438/150 |
| 6,897,131 | B2 | 5/2005 | Ramachandran et al. | |
| 6,916,398 | B2 | 7/2005 | Chen et al. | |
| 6,998,153 | B2 | 2/2006 | Chiang et al. | |
| 7,132,338 | B2 * | 11/2006 | Samoilov et al. | 438/300 |
| 7,166,528 | B2 * | 1/2007 | Kim et al. | 438/607 |
| 7,312,128 | B2 * | 12/2007 | Kim et al. | 438/300 |
| 7,521,365 | B2 * | 4/2009 | Kim et al. | 438/694 |
| 7,560,352 | B2 * | 7/2009 | Carlson et al. | 438/300 |
| 7,572,715 | B2 * | 8/2009 | Kim et al. | 438/488 |
| 2004/0043149 | A1 * | 3/2004 | Gordon et al. | 427/255.31 |
| 2004/0171238 | A1 * | 9/2004 | Arena et al. | 438/507 |
| 2004/0224089 | A1 * | 11/2004 | Singh et al. | 427/255.27 |
| 2005/0054171 | A1 * | 3/2005 | Chu et al. | 438/312 |
| 2005/0079691 | A1 | 4/2005 | Kim et al. | |
| 2005/0079692 | A1 * | 4/2005 | Samoilov et al. | 438/481 |
| 2005/0241671 | A1 * | 11/2005 | Dong et al. | 134/1.1 |
| 2006/0051958 | A1 * | 3/2006 | Ho | 438/638 |
| 2006/0115933 | A1 * | 6/2006 | Ye et al. | 438/139 |
| 2006/0115934 | A1 * | 6/2006 | Kim et al. | 438/149 |
| 2006/0148151 | A1 * | 7/2006 | Murthy et al. | 438/197 |

(Continued)

FOREIGN PATENT DOCUMENTS

| KR | 10-2003-0002646 | 1/2003 |
|---|---|---|
| KR | 10-2004-0003881 | 1/2004 |

(Continued)

OTHER PUBLICATIONS

"Search Report mailed Mar. 23, 2009 for International Application No. PCT/US2008/086919 filed Dec. 16, 2008", 7 pgs.

(Continued)

*Primary Examiner* — Bob M Kunemund
(74) *Attorney, Agent, or Firm* — Serville Whitney LLC

(57) ABSTRACT

Methods for formation epitaxial layers containing silicon and carbon doped with phosphorus are disclosed. The pressure is maintained equal to or above 100 torr during deposition. The methods result in the formation of a film including substitutional carbon. Specific embodiments pertain to the formation and treatment of epitaxial layers in semiconductor devices, for example, Metal Oxide Semiconductor Field Effect Transistor (MOSFET) devices.

19 Claims, 2 Drawing Sheets

U.S. PATENT DOCUMENTS

| | | | |
|---|---|---|---|
| 2006/0216876 A1* | 9/2006 | Kim et al. | 438/149 |
| 2006/0234488 A1 | 10/2006 | Kim et al. | |
| 2006/0234504 A1* | 10/2006 | Bauer et al. | 438/674 |
| 2006/0240630 A1 | 10/2006 | Bauer et al. | |
| 2006/0260538 A1* | 11/2006 | Ye et al. | 117/89 |
| 2007/0207596 A1* | 9/2007 | Kim et al. | 438/478 |
| 2008/0237608 A1* | 10/2008 | Richieri | 257/77 |
| 2008/0251851 A1* | 10/2008 | Pan et al. | 257/369 |
| 2008/0283926 A1* | 11/2008 | Sridhar | 257/369 |

FOREIGN PATENT DOCUMENTS

| | | |
|---|---|---|
| KR | 10-2007-0006852 | 1/2007 |
| WO | WO-2006/060543 | 6/2006 |
| WO | WO-2006/083821 | 8/2006 |

OTHER PUBLICATIONS

"Written Opinion mailed Mar. 23, 2009 for International Application No. PCT/US2008/086919" filed Dec. 16, 2008, 4 pgs.

"PCT/US 07/86984—Search Report—Apr. 16, 2008".

"PCT/US 07/86984—Written Opinion—Apr. 16, 2008".

Bauer, M., "Tensile Strained Selective Silicon Carbon Alloys for Recessed Source Drain Areas of Devices", *Abstract 210th ECS Meeting* Oct. 29 through Nov. 3, 2006.

Tanaka, Hideki et al., "Selective Growth of 3C-Si and Application to Devices", *IEICE Technical Report, Japan, Institute of Electronics, Information and Communication Engineers*, vol. 91, No. 363 Dec. 6, 1991, 91-95.

\* cited by examiner

FORMATION OF IN-SITU PHOSPHORUS DOPED EPITAXIAL LAYER CONTAINING SILICON AND CARBON

BACKGROUND

Embodiments of the present invention generally relate to formation of in-situ phosphorus doped epitaxial layers containing silicon and carbon. Specific embodiments pertain to the formation of such epitaxial layers in semiconductor devices, for example, Metal Oxide Semiconductor Field Effect Transistor (MOSFET) devices.

The amount of current that flows through the channel of a MOS transistor is directly proportional to a mobility of carriers in the channel, and the use of high mobility MOS transistors enables more current to flow and consequently faster circuit performance. Mobility of the carriers in the channel of an MOS transistor can be increased by producing a mechanical stress in the channel. A channel under compressive strain, for example, a silicon-germanium channel layer grown on silicon, has significantly enhanced hole mobility to provide a pMOS transistor. A channel under tensile strain, for example, a thin silicon channel layer grown on relaxed silicon-germanium, achieves significantly enhanced electron mobility to provide an nMOS transistor.

An nMOS transistor channel under tensile strain can also be provided by forming one or more carbon-doped silicon epitaxial layers, which may be complementary to the compressively strained SiGe channel in a pMOS transistor. Thus, carbon-doped silicon and silicon-germanium epitaxial layers can be deposited on the source/drain of nMOS and pMOS transistors, respectively. The source and drain areas can be either flat or recessed by selective Si dry etching. When properly fabricated, nMOS sources and drains covered with carbon-doped silicon epitaxy imposes tensile stress in the channel and increases nMOS drive current.

To achieve enhanced electron mobility in the channel of nMOS transistors having a recessed source/drain using carbon-doped silicon epitaxy, it is desirable to selectively form the carbon-doped silicon epitaxial layer on the source/drain either through selective deposition or by post-deposition processing. Furthermore, it is desirable for the carbon-doped silicon epitaxial layer to contain substitutional C atoms to induce tensile strain in the channel. Higher channel tensile strain can be achieved with increased substitutional C content in a carbon-doped silicon source and drain.

Generally, sub-100 nm CMOS (complementary metal-oxide semiconductor) devices require a junction depth to be less than 30 nm. Selective epitaxial deposition is often utilized to form epitaxial layers ("epilayers") of silicon-containing materials (e.g., Si, SiGe and SiC) into the junctions. Selective epitaxial deposition permits growth of epilayers on silicon moats with no growth on dielectric areas. Selective epitaxy can be used within semiconductor devices, such as elevated source/drains, source/drain extensions, contact plugs or base layer deposition of bipolar devices.

A typical selective epitaxy process involves a deposition reaction and an etch reaction. During the deposition process, the epitaxial layer is formed on a monocrystalline surface while a polycrystalline layer is deposited on at least a second layer, such as an existing polycrystalline layer and/or an amorphous layer. The deposition and etch reactions occur simultaneously with relatively different reaction rates to an epitaxial layer and to a polycrystalline layer. However, the deposited polycrystalline layer is generally etched at a faster rate than the epitaxial layer. Therefore, by changing the concentration of an etchant gas, the net selective process results in deposition of epitaxy material and limited, or no; deposition of polycrystalline material. For example, a selective epitaxy process may result in the formation of an epilayer of silicon-containing material on a monocrystalline silicon surface while no deposition is left on the spacer.

Selective epitaxial deposition of silicon-containing materials has become a useful technique during formation of elevated source/drain and source/drain extension features, for example, during the formation of silicon-containing MOSFET (metal oxide semiconductor field effect transistor) devices. Source/drain extension features are manufactured by etching a silicon surface to make a recessed source/drain feature and subsequently filling the etched surface with a selectively grown epilayers, such as a silicon germanium (SiGe) material. Selective epitaxy permits near complete dopant activation with in-situ doping, so that the post annealing process is omitted. Therefore, junction depth can be defined accurately by silicon etching and selective epitaxy. On the other hand, the ultra shallow source/drain junction inevitably results in increased series resistance. Also, junction consumption during silicide formation increases the series resistance even further. In order to compensate for junction consumption, an elevated source/drain is epitaxially and selectively grown on the junction. Typically, the elevated source/drain layer is undoped silicon.

During deposition of the silicon-containing layers, a source of an elemental dopant such as boron, arsenic, phosphorus, gallium or aluminum may be included in the deposition gas, resulting in in-situ doping of the epitaxial layer. Dopants provide the deposited silicon-containing compounds with various conducting characteristics, such as directional electron flow in a controlled and desired pathway required by the electronic device.

Current selective epitaxy processes usually require a high reaction temperature, such as about 800° C., 1,000° C. or higher. Such high temperatures are not desirable during a fabrication process due to thermal budget considerations and possible uncontrolled nitridation reactions to the substrate surface. In addition, most of C atoms incorporated through typical selective Si:C epitaxy processes at the higher process temperatures occupy non-substitutional (i.e. interstitial) sites of the Si lattice. By lowering growth temperature, a higher fraction of substitutional carbon level can be achieved (e.g. nearly 100% at growth temperature of 550° C.), however, the slow growth rate at these lower temperatures is undesirable for device applications, and such selective processing might not be possible at the lower temperatures. Furthermore, Si:C films doped with phosphorus exhibit an even lower growth rate.

Therefore, there is a need to have a process for epitaxially depositing silicon and silicon-containing compounds with dopants such as phosphorus. Furthermore, the process should exhibit a fast deposition rate, maintain a process temperature, such as about 800° C. or less, and preferably about 700° C. or less, and have a high substitutional carbon concentration. Such methods would be useful in the manufacture of transistor devices.

SUMMARY OF THE INVENTION

One embodiment of the present invention relates to methods of forming and processing epitaxial layers containing silicon and carbon and phosphorus. Other embodiments relate to methods manufacturing of fabricating transistor devices including epitaxial layers containing silicon and carbon and phosphorus. According to embodiments of the invention, substitutional carbon content is increased in Si:C films.

In one or more embodiments, the epitaxial growth rate and etchant activity are also increased when the pressure during deposition is increased to at least about 100 torr.

In accordance with one embodiment of the present invention, a method of forming an epitaxial layer containing Si and C on a substrate is provided comprising placing a substrate in a process chamber; and exposing the substrate to a silicon source, a carbon source and a phosphorus source while maintaining the pressure in the process chamber at least about 100 torr to form a Si:C epitaxial film doped with phosphorus on at least a portion of the substrate. In certain embodiments, the pressure in the process chamber is maintained at least about 200 torr. In a specific embodiment, the pressure is maintained at least about 300 torr. In one embodiment, the temperature in the process chamber is less than or equal to about 700° C. According to one or more embodiments, the resulting epitaxial film contains substitutional carbon that is at least about 40%, for example, 50% of the total carbon contained in the film. In certain embodiments, the phosphorus source comprises phosphine and the phosphorus concentration in the epitaxial film is at least about 1E20 atoms/cm$^3$.

According to certain embodiments, the substrate includes a monocrystalline surface and at least a second surface selected from an amorphous surface, a polycrystalline surface and combinations thereof, wherein an epitaxial layer is formed on the monocrystalline surface and an amorphous or a polycrystalline layer is formed on the second surface. In one or more embodiments, the substrate may be further processed by subsequently exposing the substrate to an etching gas. The etching gas may comprise HCl according to one or more embodiments, and exposure to the etching gas occurs at a temperature less than about 700° C.

In one or more embodiments, a method of forming an epitaxial layer containing Si and C on a substrate is provided, the method comprising placing a substrate in a process chamber including a monocrystalline surface and at least a second surface selected from an amorphous surface, a polycrystalline, surface and combinations thereof; and exposing the substrate to a silicon source, a carbon source, a phosphorus source, and etch source while maintaining the pressure in the process chamber at least about 100, for example, greater than about 200 torr to form a Si:C epitaxial film doped with phosphorus on the monocrystalline surface, without any growth on the second surface. In one or more embodiments, the second surface includes a dielectric surface.

The processes of the present invention may be used as a fabrication step of a transistor manufacturing process. Thus, embodiments of the invention pertain to a method of manufacturing a transistor comprising forming a gate dielectric on a substrate in a process chamber; forming a gate electrode on the gate dielectric; forming source/drain regions on the substrate having a second conductivity on opposite sides of the electrode and defining a channel region between the source/drain regions; and depositing an epitaxial layer containing silicon and carbon doped with phosphorus directly on the source/drain regions while maintaining the pressure in the process chamber at least at about 100 torr. The process conditions may be adjusted as described above.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart form the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
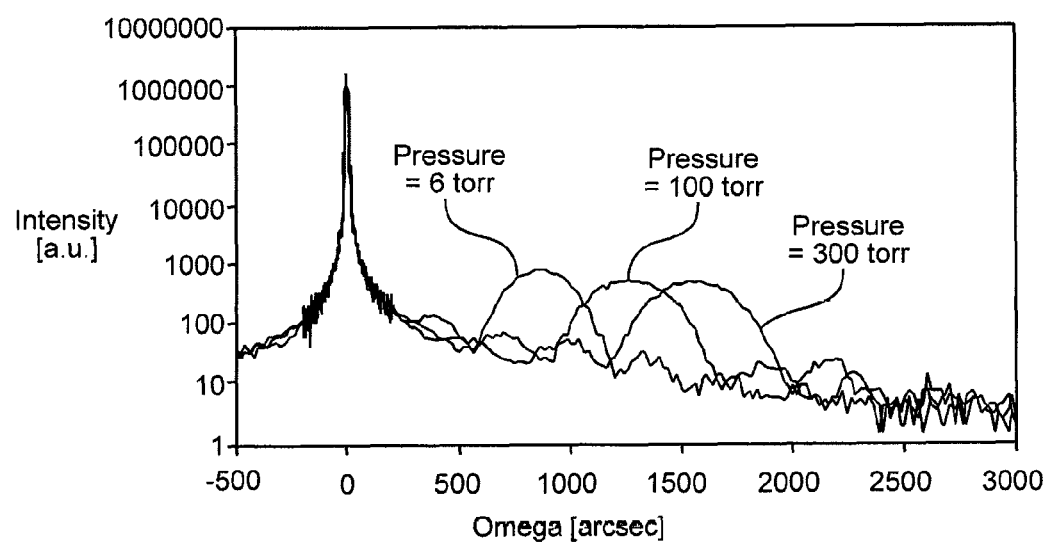
FIG. 1 is a high resolution X-ray diffractometer (HR-XRD) spectra of epitaxial layers containing silicon and carbon produced under high pressure.

Embodiments of the invention generally provide a method of forming an epitaxial layer containing silicon and carbon doped with phosphorus. Other embodiments pertain to a method of manufacturing a transistor. According to one or more embodiments, during epitaxial deposition, the pressure in the process chamber is at least about 100 torr. In specific embodiments, the pressure may be at least about 200 torr or at least about 300 torr.

As used herein, epitaxial deposition refers to the deposition of a single crystal layer on a substrate, so that the crystal structure of the deposited layer matches the crystal structure of the substrate. Thus, an epitaxial layer or film is a single crystal layer or film having a crystal structure that matches the crystal structure of the substrate. Epitaxial layers are distinguished from bulk substrates and polysilicon layers.

According to embodiments of the present invention, the substrate upon which the epitaxial film is deposited is typically a silicon substrate, and it can be a patterned substrate. Patterned substrates are substrates that include electronic features formed into or onto the substrate surface. The patterned substrate may contain monocrystalline surfaces and at least one secondary surface that is non-monocrystalline, such as polycrystalline or amorphous surfaces. Monocrystalline surfaces include the bare crystalline substrate or a deposited single crystal layer usually made from a material such as silicon, silicon germanium or silicon carbon. Polycrystalline or amorphous surfaces may include dielectric materials, such as oxides or nitrides, specifically silicon oxide or silicon nitride, as well as amorphous silicon surfaces.

The silicon carbon layer may be deposited using an epitaxial process in a suitable processing chamber such as an Epi RP or Centura, both of which are available from Applied Materials, Santa Clara, Calif. Generally, the process chamber is maintained at a consistent temperature throughout the epitaxial process. However, some steps may be performed at varying temperatures. The process chamber is kept at a temperature in the range from about 250° C. to about 1,000° C., for example, from about 500° C. to about 900° C. The appropriate temperature to conduct the epitaxial process may depend on the particular precursors used to deposit and/or etch the silicon and carbon-containing materials, and can be determined by a person skilled in the art. The process chamber is usually maintained at a pressure from about 0.1 Torr to about 600 Torr. The pressure may fluctuate during and between this deposition step, but is generally constant.

During the epitaxial deposition process, the substrate is exposed to a deposition gas to form an epitaxial layer on the monocrystalline surface while forming a polycrystalline layer on the secondary surfaces. The specific exposure time of the deposition process is determined in relation to the exposure time during the etching process, as well as particular precursors and temperature used in the process. Generally, the substrate is exposed to the deposition gas long enough to form a maximized thickness of an epitaxial layer while forming a minimal thickness of a polycrystalline layer that may be easily etched away during deposition.

The deposition gas contains at least a silicon source, a carrier gas, and a carbon source. In an alternative embodiment, the deposition gas may include at least one etchant, such as hydrogen chloride or chlorine.

The silicon source is usually provided into the process chamber at a rate in a range from about 5 sccm to about 500 sccm, for example, from about 10 sccm to about 300 sccm, and specifically from about 50 sccm to about 200 sccm, more specifically, about 100 sccm. Silicon sources useful in the deposition gas to deposit silicon and carbon-containing compounds include, but not limited to, silanes, halogenated silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Halogenated silanes include compounds with the empirical formula $X'_ySi_xH_{(2x+2-y)}$, where $X'$=F, Cl, Br or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$).

The silicon source is usually delivered into the process chamber along with a carrier gas. The carrier gas has a flow rate from about 1 slm (standard liters per minute) to about 100 slm, for example, from about 5 slm to about 75 slm, and specifically from about 10 slm to about 50 slm, for example, about 25 slm. Carrier gases may include nitrogen ($N_2$), hydrogen ($H_2$), argon, helium and combinations thereof. An inert carrier gas is preferred and includes nitrogen, argon, helium and combinations thereof. A carrier gas may be selected based on the precursor(s) used and/or the process temperature during the epitaxial process 120. Usually the carrier gas is the same throughout each step. However, some embodiments may use different carrier gases in particular steps.

The carbon source provided to the process chamber during step 120 with the silicon source and carrier gas to form a silicon and carbon-containing compound, such as a silicon carbon material, is usually provided into the process chamber at a rate in the range from about 0.1 sccm to about 20 sccm, for example, from about 0.5 sccm to about 10 sccm, and more specifically from about 1 sccm to about 5 sccm, for example, about 2 sccm. Carbon sources useful to deposit silicon and carbon-containing compounds include, but not limited to, organosilanes, alkyls, alkenes and alkynes of ethyl, propyl and butyl. Such carbon sources include methylsilane ($CH_3SiH_3$), dimethylsilane (($CH_3$)$_2SiH_2$), trimethylsilane (($CH3$)$3SiH$), ethylsilane ($CH_3CH_2SiH_3$), methane ($CH_4$), ethylene ($C_2H_4$), ethyne ($C_2H_2$), propane ($C_3H_8$), propene ($C_3H_6$), butyne ($C_4H_6$), as well as others. The carbon concentration of an epitaxial layer is in the range from about 200 ppm to about 5 atomic %, for example, from about 1 atomic % to about 3 atomic %, more specifically at least about 2 atomic % or at least about 1.5 atomic %. In one embodiment, the carbon concentration may be graded within an epitaxial layer, preferably graded with a higher carbon concentration in the lower portion of the epitaxial layer than in the upper portion of the epitaxial layer. Alternatively, a germanium source and a carbon source may both be added into the process chamber with the silicon source and carrier gas to form a silicon and carbon-containing compound, such as a silicon germanium carbon material.

The deposition process is terminated. In one example, the process chamber may be flushed with a purge gas or the carrier gas and/or the process chamber may be evacuated with a vacuum pump. The purging and/or evacuating processes remove excess deposition gas, reaction by-products and other contaminates. In another example, once the deposition process has terminated, the etching process is immediately started without purging and/or evacuating the process chamber.

Etching

An optional etching process may be performed. The etching process removes a portion of the epitaxial layer on the substrate surface. The etching process removes both epitaxial or monocrystalline materials and amorphous or polycrystalline materials. Polycrystalline layers, if any, deposited on the substrate surface are removed at a faster rate than the epitaxial layers. The time duration of the etching process is balanced with the time duration of the deposition process to result in net deposition of the epitaxial layer selectively formed on desired areas of the substrate. Therefore, the net result of the deposition process and etching process to form selective and epitaxially grown silicon and carbon-containing material while minimizing, if any, growth of polycrystalline material.

During the etching process, the substrate is exposed to the etching gas for a period of time in the range from about 10 seconds to about 90 seconds, for example, from about 20 seconds to about 60 seconds, and more specifically from about 30 seconds to about 45 seconds. The etching gas includes at least one etchant and a carrier gas. The etchant is usually provided into the process chamber at a rate in the range from about 10 sccm to about 700 sccm, for example from about 50 sccm to about 500 sccm, The etchant used in the etching gas may include chlorine ($Cl_2$), hydrogen chloride (HCl), boron trichloride ($BCl_3$), methylchloride ($CH3Cl$), carbon tetrachloride ($CCl_4$), chlorotrifluoride ($ClF_3$) and combinations thereof. Preferably, chlorine or hydrogen chloride is used as the etchant.

The etchant is usually provided into the process chamber with a carrier gas. The carrier gas has a flow rate in the range from about 1 slm to about 100 slm, for example, from about 5 slm to about 75 slm, and more specifically from about 10 slm to about 50 slm, for example, about 25 slm. Carrier gases may include nitrogen ($N_2$), hydrogen ($H_2$), argon, helium and combinations thereof. In some embodiment, an inert carrier gas is preferred and includes nitrogen, argon, helium and combinations thereof. A carrier gas may be selected based upon specific precursor(s) and/or temperature used during the epitaxial process.

The etching process is terminated. In one example, the process chamber may be flushed with a purge gas or the carrier gas and/or the process chamber may be evacuated with a vacuum pump. The purging and/or evacuating processes remove excess etching gas, reaction by-products and other contaminates. In another example, once the etching process has terminated, the thickness of the epitaxial layer is immediately started without purging and/or evacuating the process chamber.

The thicknesses of the epitaxial layer and the polycrystalline layer may be determined. If the predetermined thicknesses are achieved, then epitaxial process is terminated. However, if the predetermined thicknesses are not achieved, then the deposition process is repeated as a cycle until the desired thicknesses are achieved. The epitaxial layer is usually grown to have a thickness at a range from about 10 Å to about 2,000 Å, for example, from about 100 Å to about 1,500 Å, and more specifically from about 400 Å to about 1,200 Å, for example, about 800 Å. The polycrystalline layer is usually deposited with a thickness, if any, in a range from an atomic layer to about 500 Å. The desired or predetermined thickness of the epitaxial silicon and carbon-containing layer or the polycrystalline silicon and carbon-containing layer is specific to a particular fabrication process. In one example, the epitaxial layer may reach the predetermined thickness while the polycrystalline layer is too thick.

Dopant Exposure

During epitaxial deposition, the epitaxial layer is exposed a dopant. Typical dopants may include at least one dopant compound to provide a source of elemental dopant, such as boron, arsenic, phosphorus, gallium or aluminum. In a particular embodiment of the invention, the silicon and carbon-containing compound is doped n-type, such as with phosphorus and/or arsenic to a concentration in the range from about $10^{15}$ atoms/cm$^3$ to about $10^{21}$ atoms/cm$^3$.

A dopant source is usually provided into the process chamber. The dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH.

A specific embodiment of the invention pertains forming in-situ phosphorus doped selective Si:C epitaxial layers at high pressure exceeding 100 torr. High pressure exceeding 100 torr results in an increased growth rate increases and increased substitutional carbon concentration as shown in FIG. 1. An experiment was conducted in which the temperature and flow rate of the siilicon and carbon precursors and carrier gas was maintained constant. The pressure was then varied at 6 torr, 100 torr and 300 torr in separate experiments, and the results are shown in FIG. 1. As seen in FIG. 1, higher pressure resulted in higher substitutional carbon concentration. Specifically, with the other process conditions being kept constant, for the sample produced at 6 torr, the subtitutional carbon was 0.8%, for the sample produced at 100 torr, the substitutional carbon was 1.1%, and for the sample produced at 300 torr, the subsitutional carbon in the sample was 1.4%.

An example of a suitable process in accordance with an embodiment of the invention in selective Si:C epitaxy resulted in a phosphorus level greater than about 2E20 atoms/cm$^3$, carbon levels at about 1.3 atomic %, and substitutional levels at about 0.6 atomic % follows. The process chamber can be maintained at a temperature of about 700° C., a pressure of about 300 torr, hydrogen carrier gas flow rate of 10 slm, dichlorosilane source gas flow rate of 200 sccm and HCl flow rate of 30 sccm. Methylsilane (1% diluted in hydrogen is flowed at 240 sccm, and phosphine (1% diluted in hydrogen) is flowed at 240 sccm. All process gases are flowed into a process chamber simultaneously and carbon-contained silicon layers doped with phorphorus are formed on a substrate. It was observed that the samples produced at higher pressure exhibited enhanced HCl etch activity. Thus, according to embodiments of the invention, higher pressure process can be utilized for etching at temperature ranges where HCl activity is weak such as less than about 700° C. In examples produced with phosphorus doping, Secondary Ion Mass Spectroscopy (SIMS) data showed that pressure in excess of 100 torr resulted in phosphorus content greater than 2 E20 atom/scm$^3$.

A process of the type described above can be used in selective deposition processes in which the deposition and etch gases are flowed simultaneously into the chamber resulting in a Si:C epitaxial film doped with phosphorus on a monocrystalline surface of a substrate, without any growth on dielectric surfaces. The higher activity of HCl at the higher pressure permits the etching to proceed at lower temperatures, for example, below about 700° C.

The epitaxial films according to embodiments of the invention may be further processed by annealing, for example, by a rapid thermal process such as rapid thermal annealing, rapid thermal processing, laser annealing, millisecond annealing, and/or spike annealing or flash annealing or combinations thereof. The annealing temperature may depend on the process used.

Figure 2:
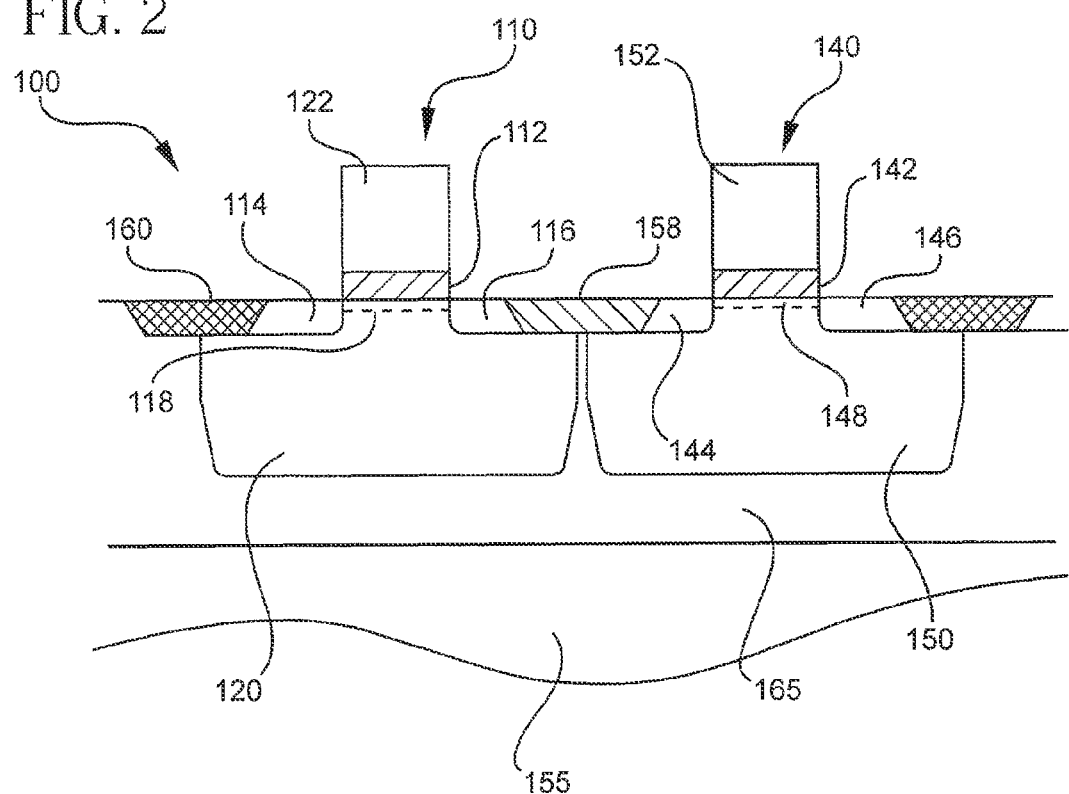
FIG. 2 is a cross-sectional view of a field effect transistor pair in accordance with an embodiment of the invention.

One or more embodiments of the present invention provide methods that are particularly useful in forming complementary metal oxide semiconductor (CMOS) integrated-circuit devices and will be described in that context. Other devices and applications are also within the scope of the invention. FIG. 2 illustrates portions of a cross sectional view of a FET pair in a typical CMOS device. Device 100 comprises a semiconductor substrate after forming wells to provide source/drain regions, gate dielectric, and gate electrode of an NMOS device and PMOS device. The device 100 can be formed using conventional semiconductor processes such as growing single crystal silicon and formation of shallow trench isolation structures by trench etching and growing or depositing dielectric in the trench openings. Detailed procedures for forming these various structures are known in the art and are not described further herein.

Device 100 comprises a semiconductor substrate 155, for example, a silicon substrate, doped with a p-type material, a p-type epitaxial silicon layer 165 on substrate 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. First isolation region 158 electrically isolates NMOS 110 and PMOS 140 transistors, and second isolation region 160 electrically isolates the pair of transistors 110 and 140 from other semiconductor devices on substrate 155.

According to one or more embodiments of the invention, NMOS transistor 110 comprises a gate electrode 122, first source region 114 and a drain region 116. The thickness of the NMOS gate electrode 122 is scalable and may be adjusted based on considerations related to device performance. NMOS gate electrode 122 has a work function corresponding to the work function of a N-type device. The source and drain regions are n-type regions on opposite sides of the gate electrode 122. Channel region 118 is interposed between source region 114 and drain region 116. A gate dielectric layer 112 separates channel region 118 and gate electrode 122. Processes for forming the NMOS gate electrode 122 and dielectric layer are known in the art and are not discussed further herein.

According to one or more embodiments, PMOS transistor 140 comprises a gate electrode 152, a source region 144 and a drain region 146. The thickness of the PMOS gate electrode 152 is scalable and may be adjusted based on considerations related to device performance. PMOS gate electrode 152 has a work function corresponding to the work function of a N-type device. The source and drain regions are p-type regions on opposite sides of gate electrode 152. Channel region 148 is interposed between source region 144 and drain region 146. A gate dielectric 142 separates channel region 148 and gate electrode 152. Dielectric 142 electrically insulates gate electrode 152 from channel region 148. It will be appreciated that the structures of the transistors 110 and 140 shown in FIG. 2 and described immediately above are exemplary only, and various variants in materials, layers, etc. are within the scope of the present invention.

Figure 3:
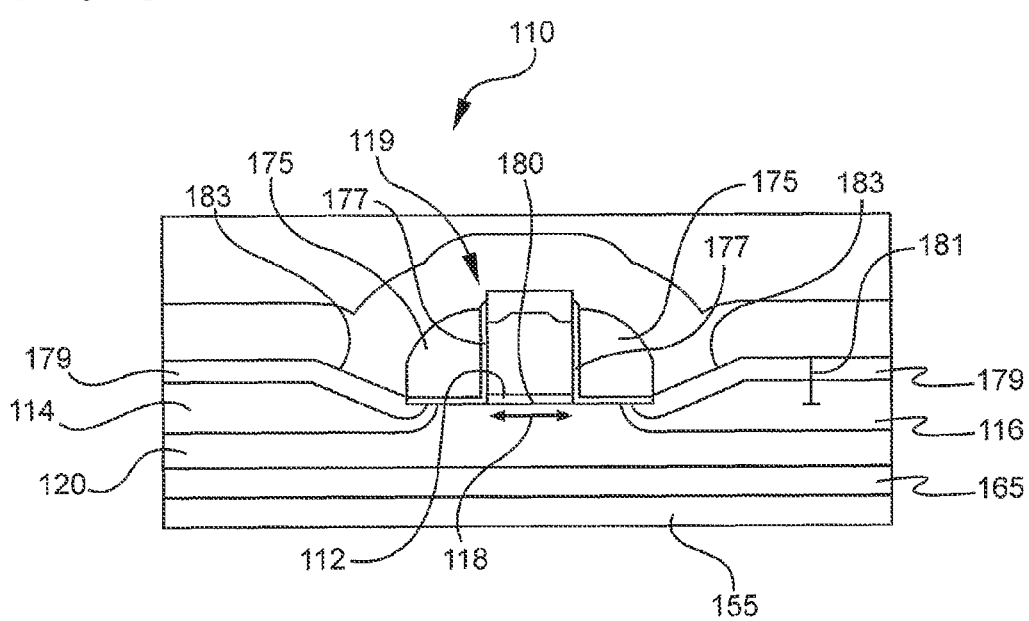
FIG. 3 is a cross-sectional view of the NMOS field effect transistor shown in FIG. 1 having additional layers formed on the device.

Referring now to FIG. 3, which shows a view of additional details of the NMOS device 110 of FIG. 2 after formation of spacers, layers over the source/drain regions, for example, suicide layers, and formation of the etch stop. It will be appreciated that the PMOS device shown in FIG. 3 may contain similar spacers and layers that may be tailored in dimensions and/or composition to affect the stress induced in the channel of the NMOS device as will be described further below. However, for illustration purposes, only NMOS device is shown and described in detail.

FIG. 3 shows spacers 175 that may be formed from suitable dielectric material incorporated around the gate 119. Offset spacers 177 may also be provided, which surround each of the spacers 175. Processes for forming shapes, sizes, and thickness of spacers 175 and 177 are known in the art and are not further described herein. A metal suicide layer 179 may be formed over the source region 114 and drain region 116. The silicide layer 179 may be formed from a suitable metal such as nickel, titanium, or cobalt by any suitable process such as sputtering or PVD (Physical Vapor Deposition). The suicide layer 179 may diffuse into portions of the underlying surfaces. Elevation of the drain region 116 is shown by the arrow 181, which is shown as the distance from the substrate surface 180 to the top of the silicide layer 179. Facet 183 of source drain region is shown as the angled surface As will be understood by the skilled artisan, the exemplary device described above may be modified to include a source/drain or source/drain extension having a Si:C epitaxial layer that may be further modified according to the methods described herein.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A method of forming an epitaxial layer containing Si and C on a substrate comprising:
    placing a substrate in a process chamber including a monocrystalline surface and at least a second surface selected from an amorphous surface, a polycrystalline surface and combinations thereof;
    exposing the substrate to a silicon source, a carbon source and a phosphorus source while maintaining the pressure in the process chamber at least about 200 torr to form a Si:C epitaxial film doped with phosphorus on at least a portion of the substrate; and
    further processing the substrate by exposing the substrate to an etching gas comprising HCl, wherein the temperature in the process chamber is less than or equal to about 700° C.

2. The method of claim 1, wherein pressure in the process chamber is maintained at least about 300 torr.

3. The method of claim 1, wherein the resulting epitaxial film contains substitutional carbon that is at least about 50% of the total carbon contained in the film.

4. The method of claim 1, wherein the phosphorus source comprises $PH_3$ and the phosphorus concentration in the epitaxial film is at least about 1E20 atoms/cm$^3$.

5. A method of forming and epitaxial layer containing Si and C on a substrate comprising:
    placing a substrate in a process chamber including a monocrystalline surface and at least a second surface selected from an amorphous surface, a polycrystalline surface and combinations thereof
    exposing the substrate to a silicon source, a carbon source, a phosphorus source, and etch source comprising HCl while maintaining the pressure in the process chamber at least about 200 torr and the temperature in the process chamber below about 700° C. to form a Si:C epitaxial film doped with phosphorus on the monocrystalline surface, without any growth on the second surface.

6. The method of claim 5, wherein the second surface includes a dielectric surface.

7. The method of claim 5, wherein phosphorus concentration in the resulting Si:C epitaxial film is greater than about 1E20 atoms/cm$^3$.

8. The method of claim 1, wherein the Si:C epitaxial film is deposited during a fabrication step of transistor manufacturing process comprising:
    forming a gate dielectric on a substrate in a process chamber;
    forming a gate electrode on the gate dielectric;
    forming source/drain regions on the substrate on opposite sides of the electrode and defining a channel region between the source/drain regions; and
    depositing the epitaxial layer containing silicon and carbon doped with phosphorus directly on the source/drain regions.

9. The method of claim 8, wherein pressure is maintained at least about 300 torr.

10. The method of claim 8, wherein the resulting epitaxial film contains substitutional carbon that is at least about 50% of the total carbon contained in the film.

11. The method of claim 1, wherein the silicon source is selected from the group consisting of silanes, halogenated silanes and organosilanes, and combinations thereof.

12. The method of claim 1, wherein the carbon source is selected from the group consisting of organosilanes, alkyls, alkenes and alkynes of ethyl, propyl and butyl, and combinations thereof.

13. The method of claim 1, wherein the phosphorus source is selected from the group consisting of phosphine and alkylphosphines, and combinations thereof.

14. The method of claim 5, wherein the silicon source is selected from the group consisting of silanes, halogenated silanes and organosilanes, and combinations thereof.

15. The method of claim 5, wherein the carbon source is selected from the group consisting of organosilanes, alkyls, alkenes and alkynes of ethyl, propyl and butyl, and combinations thereof.

16. The method of claim 5, wherein the phosphorus source is selected from the group consisting of phosphine and alkylphosphines, and combinations thereof.

17. The method of claim 5, wherein the Si:C epitaxial film is deposited during a fabrication step of transistor manufacturing process comprising:
forming a gate dielectric on a substrate in a process chamber;
forming a gate electrode on the gate dielectric;
forming source/drain regions on the substrate on opposite sides of the electrode and defining a channel region between the source/drain regions; and
depositing the epitaxial layer containing silicon and carbon doped with phosphorus directly on the source/drain regions.

18. The method of claim 17, wherein pressure is maintained at least about 300 torr.

19. The method of claim 17, wherein the resulting epitaxial film contains substitutional carbon that is at least about 50% of the total carbon contained in the film.

* * * * *